(12) United States Patent
Lee et al.

(10) Patent No.: US 8,043,922 B2
(45) Date of Patent: Oct. 25, 2011

(54) METHOD OF FABRICATING SEMICONDUCTOR DEVICE

(75) Inventors: Jun-bum Lee, Seoul (KR); Tae-hong Ha, Suwon-si (KR); Seong-hwee Cheong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/696,886

(22) Filed: Jan. 29, 2010

(65) Prior Publication Data

US 2010/0197103 A1     Aug. 5, 2010

(30) Foreign Application Priority Data

Jan. 30, 2009   (KR) .................. 10-2009-0007516

(51) Int. Cl.
    *H01L 21/336*      (2006.01)
(52) U.S. Cl. ........ 438/305; 438/231; 438/303; 438/527; 257/E21.433; 257/E21.437
(58) Field of Classification Search .............. 438/23, 438/176, 181, 184; 257/E21.4, E21.532
See application file for complete search history.

(56) References Cited

U.S. PATENT DOCUMENTS

2006/0019456 A1* 1/2006 Bu et al. ................. 438/303
2007/0281416 A1* 12/2007 Baars et al. ............. 438/238
2008/0160691 A1* 7/2008 Lim ........................ 438/261
2009/0039442 A1* 2/2009 Han et al. ................ 257/384

FOREIGN PATENT DOCUMENTS

| KR | 1020000055847 A | 9/2000 |
| KR | 1020030001920 A | 1/2003 |
| KR | 1020060036705 A | 5/2006 |
| KR | 1020060133700 A | 12/2006 |

* cited by examiner

*Primary Examiner* — Cheung Lee
(74) *Attorney, Agent, or Firm* — Myers Bigel Sibley & Sajovec, P.A.

(57) ABSTRACT

A method of fabricating a semiconductor device, can be provided by forming gate structures for transistors on a semiconductor substrate in a cell region and in a peripheral circuit region. An offset spacer can be formed including a first material on the gate structures. A first ion implantation can be done using the gate structures and the offset spacer as an ion implantation mask to form source/drain regions. A material layer can be formed including a second material on the semiconductor substrate and on the gate structures. A material layer can be formed of a third material, having an etch selectivity with respect to the second material, on the material layer of the second material. An etch-back can be performed the material layer comprising the third material in the cell region and in the peripheral region, to simultaneously expose the source/drains region in the peripheral region and not expose the source/drain regions in the cell region.

13 Claims, 7 Drawing Sheets

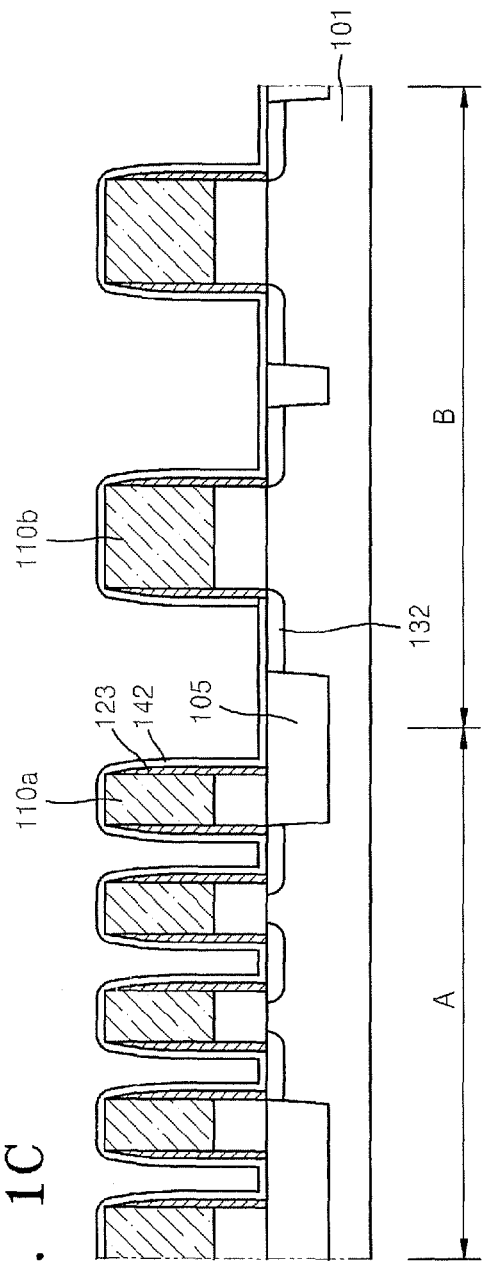
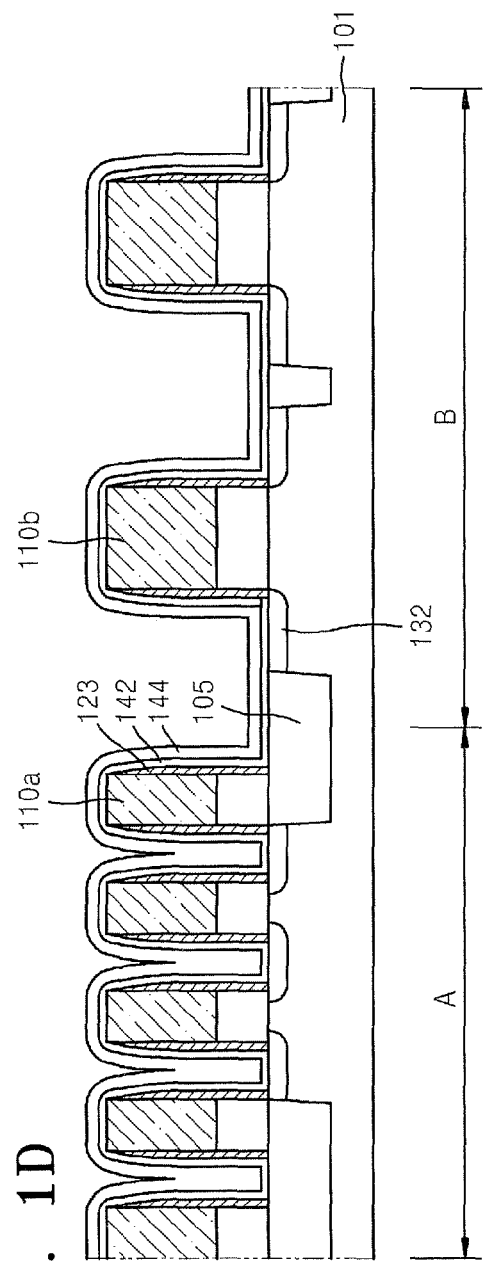
FIG. 1C
FIG. 1D

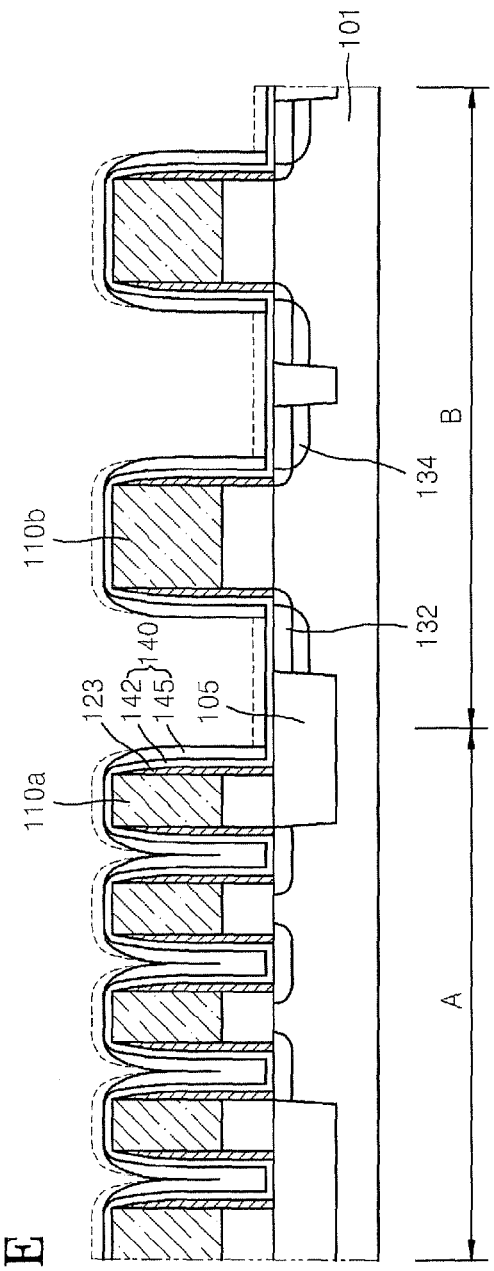
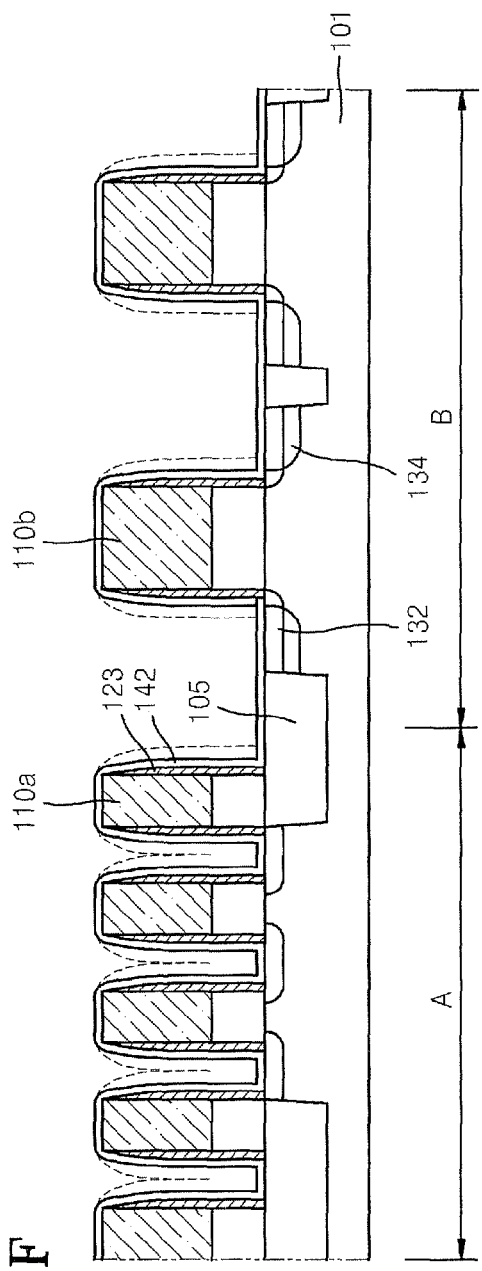
FIG. 1E
FIG. 1F

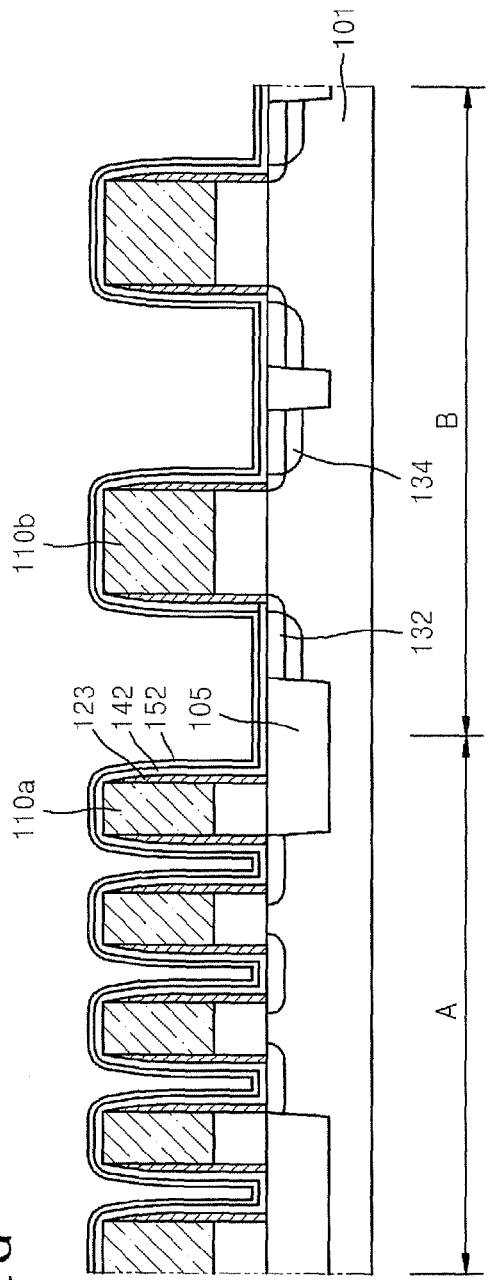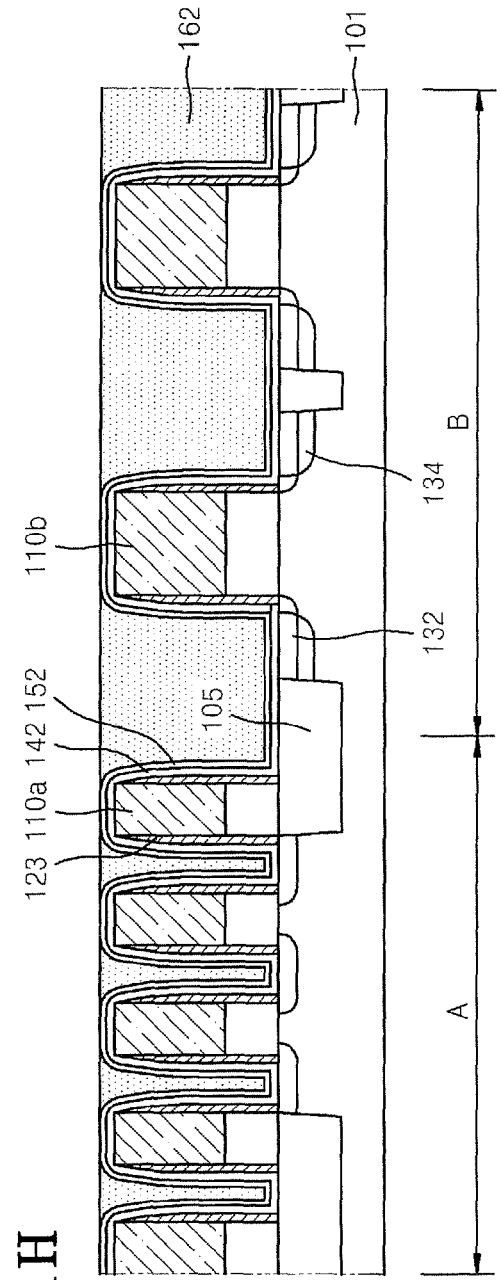

METHOD OF FABRICATING SEMICONDUCTOR DEVICE

CROSS-REFERENCE TO RELATED APPLICATIONS

This application claims the benefit of Korean Patent Application No. 10-2009-0007516, filed on Jan. 30, 2009, in the Korean Intellectual Property Office, the disclosure of which is incorporated herein in its entirety by reference.

BACKGROUND

The inventive concept relates to a method of fabricating a semiconductor device, and more particularly, to a method of fabricating a semiconductor device with reduced photomasks.

In a semiconductor device including a cell region and a peripheral circuit region, the structures, sizes, and distances of semiconductor elements disposed in the cell region may be different from those of semiconductor elements disposed in the peripheral circuit region. Accordingly, the semiconductor elements disposed in the cell region may be fabricated separately from the semiconductor elements disposed in the peripheral circuit region, thereby increasing manufacturing costs.

SUMMARY

According to an aspect of the inventive concept, there is provided a method of fabricating a semiconductor device, the method can include forming gate structures for transistors on a semiconductor substrate in a cell region and in a peripheral circuit region, forming an offset spacer of a first material on the gate structure, performing first ion implantation for source/drain region formation using the gate structures and the offset spacer as an ion implantation mask, forming a material layer of a second material on the semiconductor substrate and the gate structures, forming a material layer of a third material, which has an etch selectivity with respect to the second material, on the material layer made of the second material, etching-back the material layer made of the third material using the material layer made of the second material as an etch stop layer to form a multi-layered spacer comprising the second material and the third material, performing second ion implantation for source/drain region formation using the gate structures and the multi-layered spacer as an ion implantation mask, and removing the material layer of the third material.

BRIEF DESCRIPTION OF THE DRAWINGS

FIGS. 1A through 1I are cross-sectional view illustrating a method of fabricating a semiconductor device, according to an embodiment of the inventive concept;

DETAILED DESCRIPTION OF THE EMBODIMENTS

Figure 1A:
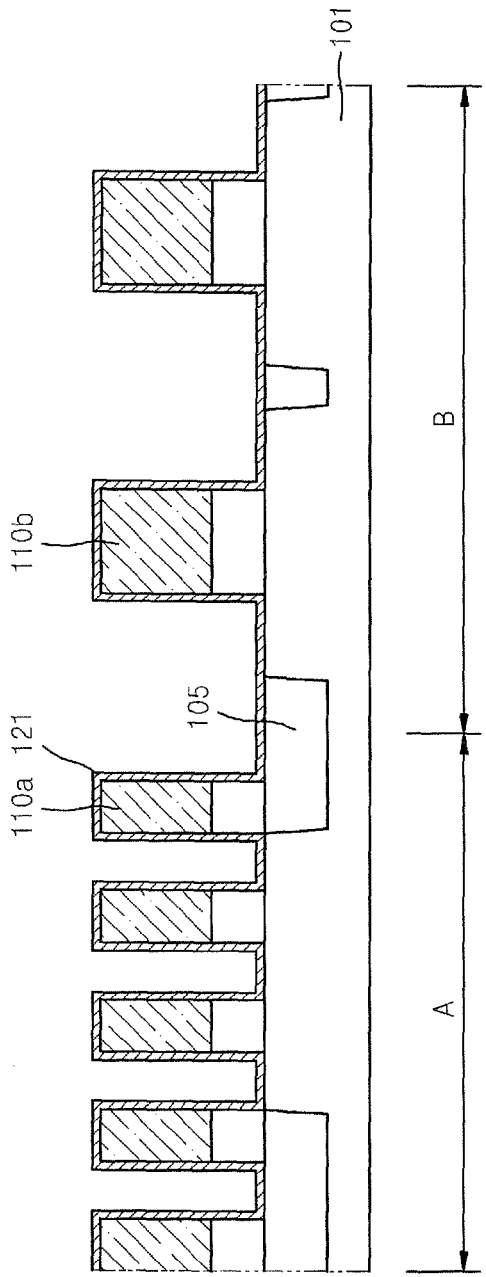

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

FIGS. 1A through 1I are cross-sectional views illustrating a method of fabricating a semiconductor device, according to an embodiment of the inventive concept.

Referring to FIG. 1A, gate structures 110a and 110b for transistors are formed on a semiconductor substrate including a cell region A and a peripheral circuit region B.

Before the gate structures 110a and 110b are formed, an active region 101 may be defined by determining the cell region A and the peripheral circuit region B and forming a device defining region 105. The device defining region 105 may be formed using shallow trench isolation (STI), and the device defining region 105 may be formed of a silicon oxide. The active region 101 may be disposed in a well of a conductivity type as desired.

Each of the gate structures 110a and 110b may have a single-layer structure or a multi-layer structure. In particular, each of the gate structures 110a and 110b may be formed by forming a tungsten layer on a polysilicon layer. However, the inventive concept is not limited thereto, and each of the gate structures 110a and 110b may be formed of a metal, a metal nitride, or a metal oxynitride.

A material layer 121 made of a first material is conformably formed on the semiconductor substrate and the gate structures 110a and 110b. The material layer 121 made of the first material may be formed using chemical vapor deposition (CVD), but the inventive concept is not limited thereto and the material layer 121 made of the first material may be formed using physical vapor deposition or the like. The first material may be any of various materials including a silicon nitride and a silicon oxide. Although it is assumed that the first material is a silicon nitride in FIG. 1, the inventive concept is not limited thereto.

Figure 1B:
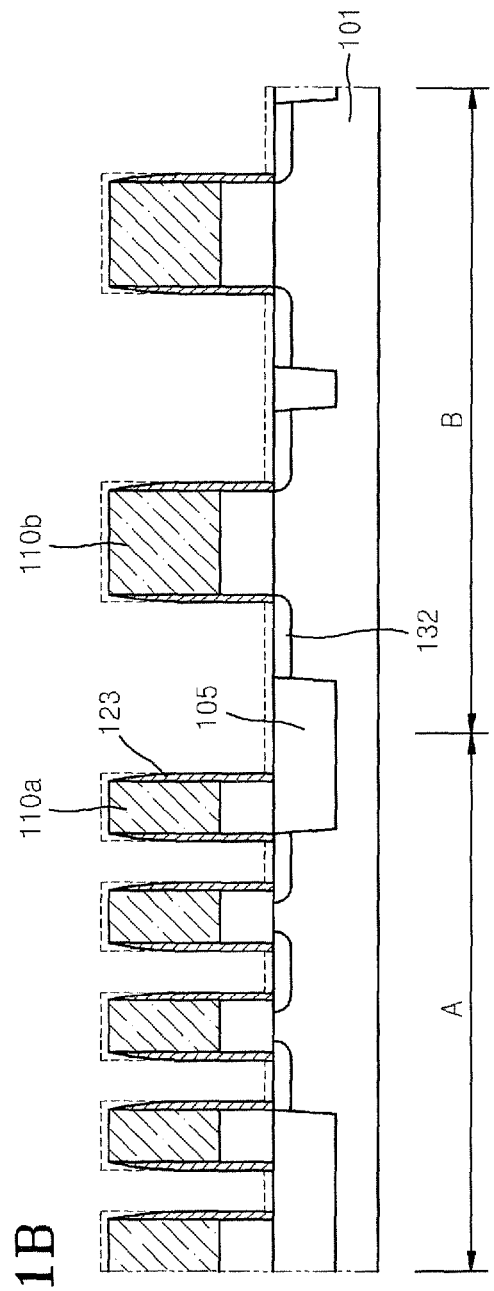

Referring to FIG. 1B, the material layer 121 made of the first material is anisotropically etched to form an offset spacer 123. The material layer 121 made of the first material may be anisotropically etched using, but not limited to, plasma etching, ion-beam etching, or sputter etching. The thickness of the offset spacer 123 may be, but not limited to, in the range of about 10 nm to about 50 nm.

Figure 2:
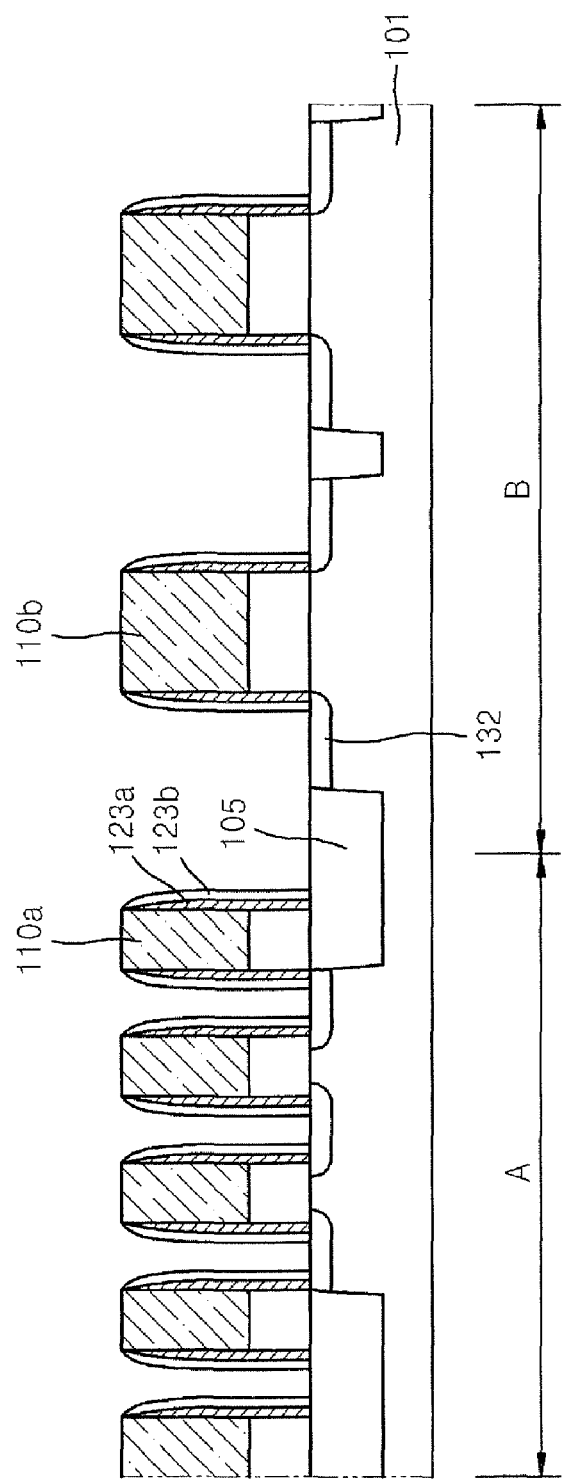
FIG. 2 is a cross-sectional view illustrating a state where an offset spacer includes two spacers.

Optionally, the offset spacer 123 may have a multi-layer structure including spacers 123a and 123b as shown in FIG. 2. Although the offset spacer 123 having the multi-layer structure includes the spacers 123a and 123b in FIG. 2, the inventive concept is not limited thereto and the offset spacer 123 having the multi-layer structure may include three or more layers. The spacers 123a and 123b may be formed by forming the first spacer 123a as described above, forming a material layer for second offset spacer formation on the semiconductor substrate and the gate structures 110a and 110b, and performing an anisotropic etching process again.

Next, first ion implantation is performed using the gate structures 110a and 110b and the offset spacer 123 as an ion implantation mask. As a result of the first ion implantation, a source/drain region may be formed in the cell region A and the peripheral circuit region B. In particular, as shown in FIG. 1B, since there is no barrier on the semiconductor substrate during the first ion implantation, the source/drain region can be formed as a very shallow junction region 132 at an appropriate density.

Referring to FIG. 1C, a material layer 142 made of a second material is formed on the semiconductor substrate, the gate structures 110a and 110b, and the offset spacer 123. The material layer 142 made of the second material may be formed using CVD, but the present invention is not limited thereto and the material layer 142 made of the second material may be formed using physical vapor deposition or the like. The second material may be any of various materials including a silicon nitride and a silicon oxide, and may be the same as the first material or different from the first material. Although it is assumed that the second material is a silicon nitride in FIG. 1, the inventive concept is not limited thereto.

In general, the sizes of the gate structures 110a and a distance between the gate structures 110a in the cell region A are less than the sizes of the gate structures 110b and a distance between the gate structures 110b in the peripheral circuit region B. It is not preferable that the source/drain region of the cell region A is not exposed and is filled with the formation of the material layer 142 made of the second material. In other words, it is preferable that there is a void between two adjacent gate structures in the cell region A due to the material layer 142 made of the second material that grows from sidewalls of the two adjacent gate structures to improve the process of forming contact structure on subsequently formed source/drain region. This is because if there is no void between the two adjacent gate structures due to the material layer 142 made of the second material, it may be difficult for the source/drain region to be electrically connected to an external circuit using a contact plug.

Referring to FIG. 1D, a material layer 144 made of a third material is formed on the material layer 142 made of the second material. The third material may be selected to have an etch selectivity with respect to the second material. For example, if the second material is a silicon nitride, the third material may be a silicon oxide. Alternatively, if the second material is a silicon oxide, the third material may be a silicon nitride. The inventive concept is not limited thereto, and the third material may be a material other than a silicon oxide or a silicon nitride as long as the third material has an etch selectivity with respect to the second material.

The material layer 144 made of the third material may be formed in the same manner as the material layer 142 made of the second material (even though the materials themselves are different), and thus a detailed explanation of a process of forming the material layer 144 made of the third material will not be given.

As described above, it is preferable that the source/drain region in the cell region A is at least partially exposed and not fully filled with the material layer 142 made of the second material. However, since the source/drain region of the cell region A is relatively narrow, the source/drain region of the cell region A may be filled with the material layer 144 made of the third material after the material layer 144 made of the third material is formed.

Referring to FIG. 1E, the material layer 144 made of the third material is etched back to obtain a dual spacer (or multi-layered spacer) 140 including the material layer 142 made of the second material and a spacer 145 made of the third material.

The material layer 144 made of the third material may be etched back using dry etching. For example, the material layer 144 made of the third material may be etched back until the material layer 142 made of the second material is exposed in the source/drain region of the peripheral circuit region B.

Optionally, after the material layer 142 made of the second material is exposed, the material layer 142 made of the second material may be etched back until the semiconductor substrate is exposed.

As a result of the etch back process, a dual spacer 140 can be obtained as described above. Second ion implantation for source/drain region formation may be performed on the dual spacer 140 using the gate structures 110a and 110b and the dual spacer 140 as an ion implantation mask. In particular, the second ion implantation may be performed with a higher energy than that of the first ion implantation so that a junction region 134 formed due to the second ion implantation can form a lightly doped drain structure along with the junction region 132 formed due to the first ion implantation.

The source/drain region between the gate structures 110a of the cell region A may not be exposed and may be filled with the spacer 145 made of the third material even after the etch back process. In this case, the second ion implantation may not be performed on the source/drain region between the gate structures 110a of the cell region A. Considering this, the dose of the first ion implantation may be determined.

The thicknesses of the material layer 142 made of the second material and the material layer 144 made of the third material affect the thickness of the dual spacer 140. Also, if a distance between the junction regions 132 or 134 formed on both sides of the gate structure 110b of the peripheral circuit region B, that is, a distance between a source region and a drain region of one gate structure, is excessively small, short channel effects, such as punch through, may occur, thereby leading to a device failure. Accordingly, the thickness of the dual spacer 140 should be determined so as to reduce such short channel effects. Considering this, the thicknesses of the material layer 142 made of the second material and the material layer 144 made of the third material may be determined.

Optionally, after the junction region 134 is formed using the second ion implantation, an ion implantation region may be activated using heat treatment such as rapid thermal annealing (RTA). The RTA may be performed at a temperature of about 800° C. to about 1200° C. for about 5 seconds to about 20 minutes.

Referring to FIG. 1F, the spacer 145 made of the third material may be removed, leaving behind only the material layer 142 made of the second material. The source/drain region of the cell region A may be exposed again after the spacer 145 made of the third material is removed.

The spacer 145 made of the third material may be removed using, but not limited to, wet etching using an etchant that is selected according to the third material.

Figure 3:
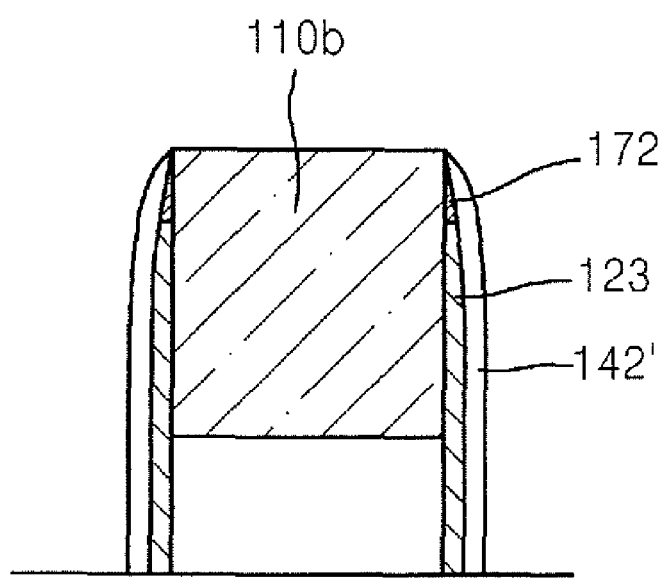
FIG. 3 is a cross-sectional view illustrating a state where an exposed portion of the offset spacer that is an oxide layer is nitridated.

If the offset spacer 123 is formed of a silicon oxide, an upper portion of the material layer 142 made of the second material is etched through the above process, so that a sidewall-shaped material layer 142' may be left behind as shown in FIG. 3 and an upper portion of the offset spacer 123 may be exposed. If the upper portion of the offset spacer 123 formed of silicon oxide is exposed, oxygen may diffuse through the exposed upper portion and oxidize the tungsten layer constituting the gate structure. That is, unless addressed, the offset spacer 123 may act as an oxygen passage as appreciated by the present inventive entity. Accordingly, in order to reduce the likelihood of the tungsten layer being oxidized, the exposed upper portion of the offset spacer 123 may be nitridated.

The exposed upper portion of the offset spacer 123 may be nitridated in a plasma reactor using a gas mixture of ammonia ($NH_3$) and nitride. FIG. 3 is a cross-sectional view illustrating a case where the exposed upper portion of the offset spacer 123 is nitridated. The nitridated exposed upper portion of the offset spacer 123 is denoted by reference numeral 172.

Referring to FIG. 1G, a planarization stop layer 152 may be formed to prevent an interlayer insulating layer from being polished more than a predetermined extent. The planarization stop layer 152 may be a silicon nitride layer.

Referring to FIG. 1H, an interlayer insulating layer 162 for device isolation is formed by depositing a material, such as a silicon oxide, using CVD, and the interlayer insulating layer 162 is planarized by using the planarization stop layer 152. The interlayer insulating layer 162 may be planarized using, but not limited to, chemical mechanical polishing (CMP).

Figure 1I:
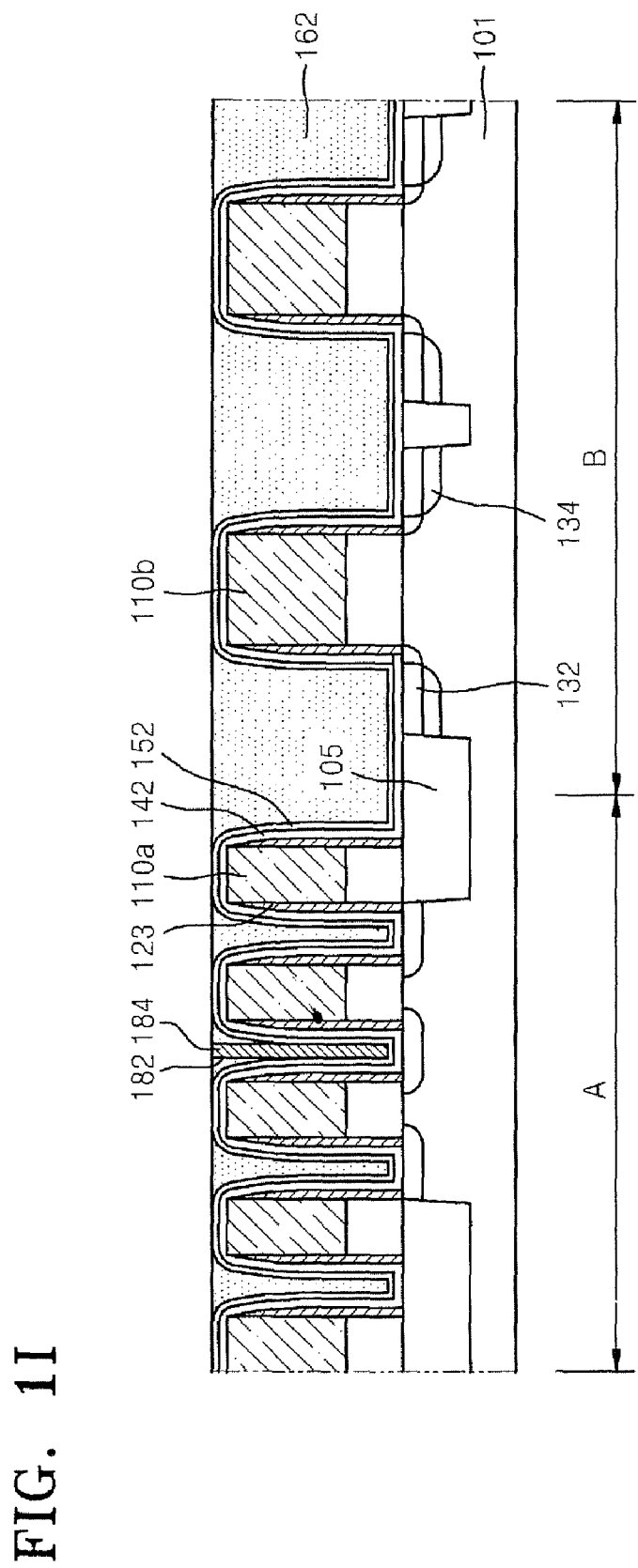

Referring to FIG. 1I, a contact hole 182 for contact plug 184 is formed in the interlayer insulating layer 162, and a contact plug 184 may be formed in a self-aligned manner (a self-aligned contact).

As described above, according to the method of fabricating the semiconductor device according to the inventive concept, a source/drain region of a cell region and a source/drain region of a peripheral circuit region can be formed at once to have an appropriate interval therebetween without identifying the cell region and the peripheral circuit region using an additional photoresist mask. Moreover, since there is no ion implantation barrier during first ion implantation, a very shallow junction region can be obtained and thus excellent device performance can be expected.

According to the method of fabricating the semiconductor device according to the inventive concept, a semiconductor device having excellent performance can be conveniently fabricated without adding a photomask.

While the inventive concept has been particularly shown and described with reference to exemplary embodiments thereof, it will be understood that various changes in form and details may be made therein without departing from the spirit and scope of the following claims.

What is claimed is:

1. A method of fabricating a semiconductor device, the method comprising:
    forming gate structures for transistors on a semiconductor substrate in a cell region and in a peripheral circuit region;
    forming an offset spacer comprising a first material on the gate structures;
    performing first ion implantation for source/drain region formation using the gate structures and the offset spacer as an ion implantation mask;
    forming a material layer comprising a second material on the semiconductor substrate and the gate structures;
    forming a material layer comprising a third material, which has an etch selectivity with respect to the second material, on the material layer comprising the second material;
    etching-back the material layer comprising the third material using the material layer comprising the second material as an etch stop layer to form a multi-layered spacer comprising the second material and the third material;
    performing second ion implantation using the gate structures and the multi-layered spacer as an ion implantation mask; and
    removing the material layer comprising the third material.

2. The method of claim 1, wherein etching-back comprises exposing a source/drain region of the peripheral circuit region and not exposing a source/drain region of the cell region due to the multi-layered spacer.

3. The method of claim 2, wherein a distance between the gate structures of the cell region is small enough not to be exposed by the etching-back and is filled with the multi-layered spacer.

4. The method of claim 1, wherein the energy of the second ion implantation is greater than the energy of the first ion implantation.

5. The method of claim 1, wherein any one of the second material and the third material comprises silicon oxide, and a remaining one comprises silicon nitride.

6. The method of claim 1, further comprising performing rapid thermal annealing (RTA) after the second ion implantation.

7. The method of claim 1, wherein the offset spacer comprising the first material comprises two or more spacers.

8. The method of claim 1, further comprising:
forming an interlayer insulating layer on the semiconductor substrate; and
forming a self-aligned contact (SAC) in the interlayer insulating layer.

9. The method of claim 8, further comprising forming a planarization stop layer before the forming of the interlayer insulating layer on the semiconductor substrate.

10. The method of claim 1, further comprising nitridating an exposed portion of the offset spacer.

11. A method of fabricating a semiconductor device, the method comprising:
forming gate structures for transistors on a semiconductor substrate in a cell region and in a peripheral circuit region;
forming an offset spacer comprising a first material on the gate structures;
performing a first ion implantation using the gate structures and the offset spacer as an ion implantation mask to form source/drain regions;
forming a material layer comprising a second material on the semiconductor substrate and on the gate structures;
forming a material layer comprising a third material, which has an etch selectivity with respect to the second material, on the material layer comprising the second material; and
simultaneously etching-back the material layer comprising the third material in the cell region and in the peripheral region, to simultaneously expose the source/drains region in the peripheral region and not expose the source/drain regions in the cell region.

12. The method of claim 11 further comprising:
performing a second ion implantation into the source/drain regions using the gate structures and a multi-layered spacer as an ion implantation mask.

13. The method of claim 11 further comprising:
removing the material layer comprising the third material.

\* \* \* \* \*